(12) United States Patent
McCloskey et al.

(10) Patent No.: US 8,029,922 B2
(45) Date of Patent: Oct. 4, 2011

(54) FORMING ELECTROPLATED INDUCTOR STRUCTURES FOR INTEGRATED CIRCUITS

(75) Inventors: Paul McCloskey, Cork (IE); Donald S. Gardner, Mountain View, CA (US); Brice Jamieson, Codette (CA); Saibal Roy, Cork (IE); Terence O'Donnell, Cork (IE)

(73) Assignee: Intel Corporation, Santa Clara, CA (US)

( * ) Notice: Subject to any disclaimer, the term of this patent is extended or adjusted under 35 U.S.C. 154(b) by 948 days.

(21) Appl. No.: 11/968,118

(22) Filed: Dec. 31, 2007

(65) Prior Publication Data

US 2009/0169874 A1 Jul. 2, 2009

(51) Int. Cl.
*H01F 1/12* (2006.01)
*B32B 15/04* (2006.01)

(52) U.S. Cl. .......... 428/693.1; 428/692.1; 428/655; 428/336; 428/704; 428/928; 428/611; 428/635; 428/668; 336/84 M; 336/177

(58) Field of Classification Search .......... None
See application file for complete search history.

(56) References Cited

U.S. PATENT DOCUMENTS

| 6,124,047 | A | 9/2000 | Hasegawa | |
|---|---|---|---|---|
| 2007/0007496 | A1 | 1/2007 | Ng et al. | |
| 2008/0003698 | A1* | 1/2008 | Park et al. | 438/3 |
| 2008/0075975 | A1* | 3/2008 | Glaser et al. | 428/693.1 |
| 2010/0001826 | A1* | 1/2010 | Gardner et al. | 336/232 |
| 2010/0259911 | A1* | 10/2010 | Gardner et al. | 361/783 |
| 2011/0001202 | A1* | 1/2011 | Gardner et al. | 257/421 |

FOREIGN PATENT DOCUMENTS

JP 60025203 2/1985

* cited by examiner

*Primary Examiner* — Aaron Austin
(74) *Attorney, Agent, or Firm* — Kathy J. Ortiz

(57) ABSTRACT

Methods and associated structures of forming microelectronic devices are described. Those methods may include forming a magnetic material on a substrate, wherein the magnetic material comprises rhenium, cobalt, iron and phosphorus, and annealing the magnetic material at a temperature below about 330 degrees Celsius, wherein the coercivity of the annealed magnetic material is below about 1 Oersted.

8 Claims, 6 Drawing Sheets

110

| | |
|---|---|
| | 106 |
| | 108 |
| | 106 |
| | 108 |
| | 106 |
| | 108 |

FORMING ELECTROPLATED INDUCTOR STRUCTURES FOR INTEGRATED CIRCUITS

BACKGROUND OF THE INVENTION

Magnetic materials may be used to fabricate microelectronic devices, such as inductor and transformer devices. Inductors and transformer structures may be used in microelectronic circuits such as voltage converters, on-chip and on-package voltage converters, RF high-frequency circuits, radar applications and EMI noise reduction circuits. To obtain the maximum inductance when operating at high frequencies, for example, magnetic flux loss should be minimized.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
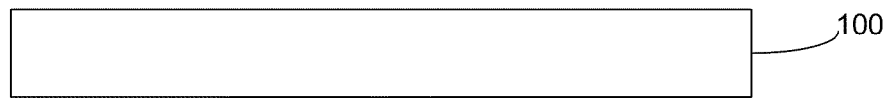
FIGS. 1a-1g represent structures according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming a magnetic material on a substrate, wherein the magnetic material comprises rhenium, cobalt, iron and phosphorus, and annealing the magnetic material at a temperature below about 330 degrees Celsius, wherein the coercivity of the annealed magnetic material is below about 1 Oersted. Methods of the present invention enable the fabrication of microelectronic devices, such as, for example, inductor and transformer structures that exhibit low coercivity and can withstand temperatures of up to about 330 degrees Celsius, thus allowing for improved device performance and compatibility with complementary metal oxide semiconductor (CMOS) processing temperatures.

FIGS. 1a-1g illustrate an embodiment of a method of forming a microelectronic structure, such as an inductor structure, for example. FIG. 1a illustrates a cross-section of a portion of a substrate 100. The substrate 100 may be comprised of materials such as, but not limited to, silicon, silicon-on-insulator, germanium, indium antimonide, lead telluride, indium arsenide, indium phosphide, gallium arsenide, gallium antimonide, or combinations thereof.

The substrate 100 may further comprise microelectronic packaging materials and structures as are known in the art. In one embodiment, the substrate 100 may include transistors and other devices that, together, form a microprocessor. In an embodiment, the substrate 100 may include devices that together form multiple microprocessor cores on a single die. In one embodiment, the substrate may include CMOS devices comprising multi-level metallization.

Figure 1B:
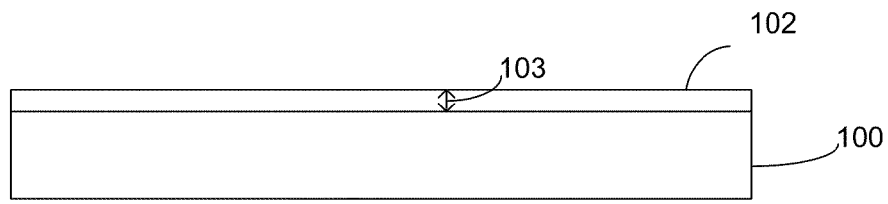

A first layer of a magnetic material 102 may be formed on the substrate 100 (FIG. 1b). In one embodiment, the magnetic material 102 may comprise high-frequency amorphous magnetic materials. In one embodiment, the magnetic material 102 may comprise cobalt, rhenium, phosphorus and iron. The first layer of magnetic material 102 may comprise a thickness 103 of about 0.1 microns to about 30 microns.

The first layer of magnetic material 102 may be formed utilizing electro-deposition techniques such as electroplating, pulse reverse electroplating and/or pulse plating at two or more current densities. In one embodiment, an electroplating bath that may be used in an electro-deposition process may comprise a cobalt salt such as cobalt chloride, a source of phosphorous such as phosphorous acid, a source of rhenium such as potassium perrhenate or sodium perrhenate and other components as required such as phosphoric acid and cobalt carbonate. In an embodiment, the phosphorous acid may comprise a concentration of about 30 grams per liter to about 65 grams per liter, the phosphoric acid may comprise about 50 grams per liter, the cobalt chloride.6H20 may comprise about 181 grams per liter, the cobalt carbonate may comprise about 39.4 grams per liter, and the potassium perrhenate may comprise a concentration of about 0.7 grams per liter. In one embodiment, the electroplating bath may comprise at least one of CoSO4.6H20 and CoCl2.6H20.

In an embodiment, the electroplating process can be performed by first patterning a photoresist material on top of a seed layer (not shown), such as a 20 nm titanium layer followed by a 0.1~0.2 um thick copper seed layer or a 0.3 um thick cobalt seed layer, for example, and then filling the exposed areas with the magnetic material 102. In one embodiment, a 0.1 micron thick copper seed layer may be formed on a planar surface, such as the substrate 100. The magnetic material 102 can also be formed on the substrate 100 by using an electroless plating process, wherein boron may be added to the chemistry, thereby eliminating the need for a seed layer.

The electrodeposited magnetic material 102 may exhibit both high resistivity and low coercivity. Consequently the magnetic material 102 may comprise both low eddy current loss and low hysteresis loss. In one embodiment, low coercivity may be achieved by utilizing an approach other than simple direct current (DC) electroplating, since plane DC plated films may exhibit perpendicular anisotropy, and hence very low permeability and high values of coercivity, in some cases.

Figure 1C:
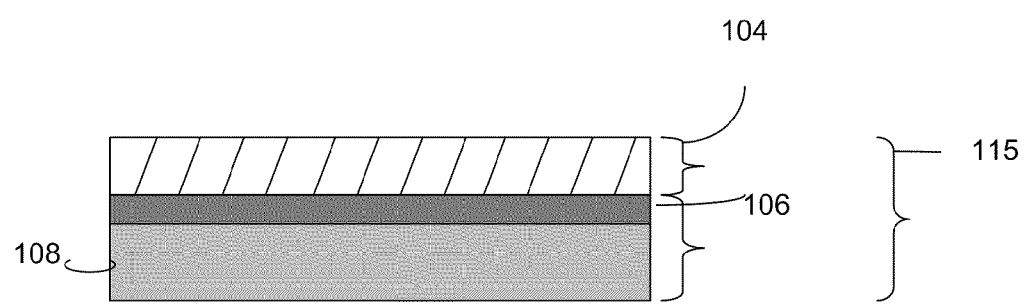
Figure 1D:
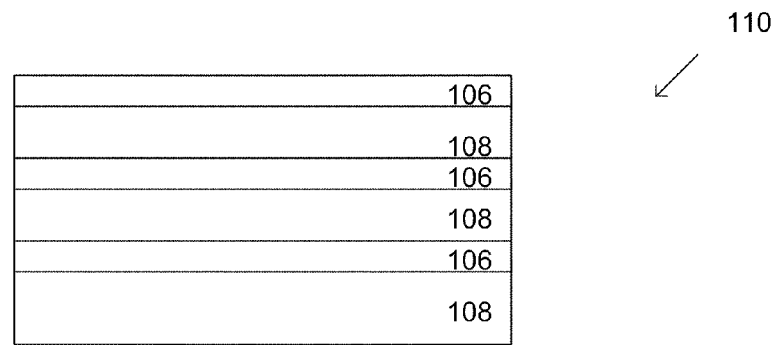
Figure 1E:
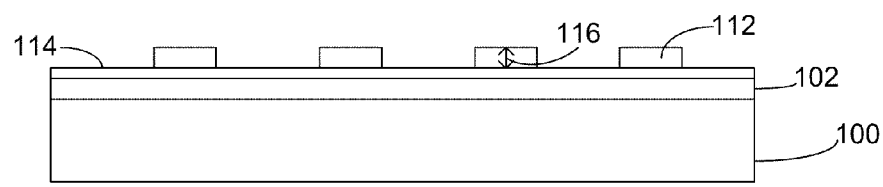
Figure 2A:
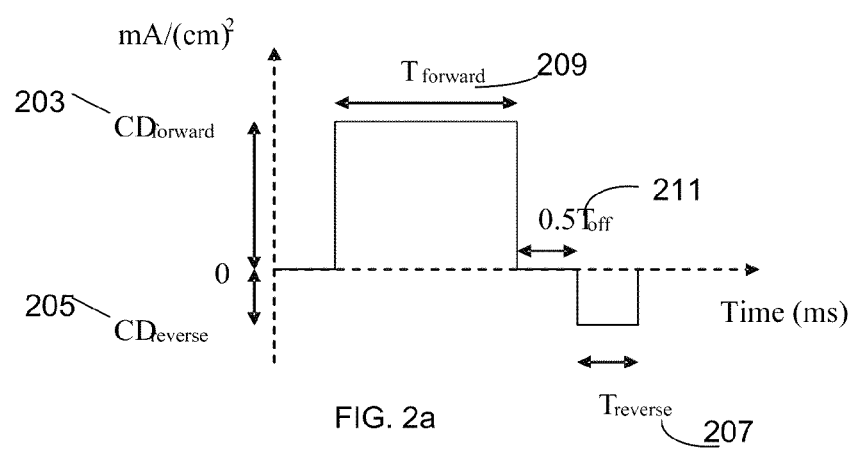
FIGS. 2a-2e represent graphs according to embodiments of the present invention.

In one embodiment, a magnetic material comprising an in-plane anisotropy and low coercivity may be achieved by forming a multilayer structure of alternating compositions. This multilayer structure may be created using either pulse reverse plating and/or pulse plating at two different current densities. An example of a pulse reverse waveform is shown in FIG. 2a, comprising a forward current density (CD) 203, a reverse CD 205, a forward time 209, an off time of 2 times 211 and a reverse time 207. The particular current densities and pulse times will vary according to the particular application. The effect of such a pulse reverse plating process on the formation of a magnetic material comprising CoPRe, for example, (such as the magnetic material 102), is shown in FIG. 1c.

An initial portion 115 of the magnetic material 102 may be formed during the forward time 209. A portion 104 of the plated magnetic material may be removed during the reverse time 207 and that removal may leave behind a phosphorous rich region 106, relative to a low phosphorous concentration/percentage region 108. This process of forming alternating high phosphorous layers 106 and low phosphorous layers 108 may form a multilayer structure 110 (FIG. 1e), which may be repeated until a desired total thickness of the magnetic material 102 may be achieved. Alternatively the high and low phosphorous layers can be formed using pulse plating at two or more current densities. In one embodiment, a total thickness of the magnetic material 102 may comprise about 0.5 microns to about 30 microns. In one embodiment, a first nanolayer of material may be formed and then a second nanolayer of material may be formed on the first nanolayer of material, wherein one of the first nanolayer and the second nanolayer comprises a percentage of phosphorus that is greater than the other of the first nanolayer and the second nanolayer. The nanolayer with the high phosphorous content may or may not have a phosphorous content high enough to make the material non-magnetic.

Hence a pulse reverse plating process may lead to the formation of a magnetic material 102 that comprises a multilayer structure 110 consisting of alternating high phosphorus concentration/percentage layers and low phosphorous concentration/percentage layers. In one embodiment, the high percentage phosphorous layer 106 may comprise a thickness of below about 5 nm and the low percentage phosphorous layer 108 may comprise a thickness of about 40 nm and below. In one embodiment, the multilayer structure 110 may comprise a multinanolayer structure 110 and the high and low percentage phosphorous layers 106, 108 may comprise high and low percentage phosphorous nanolayers 106, 108.

Figure 2B:
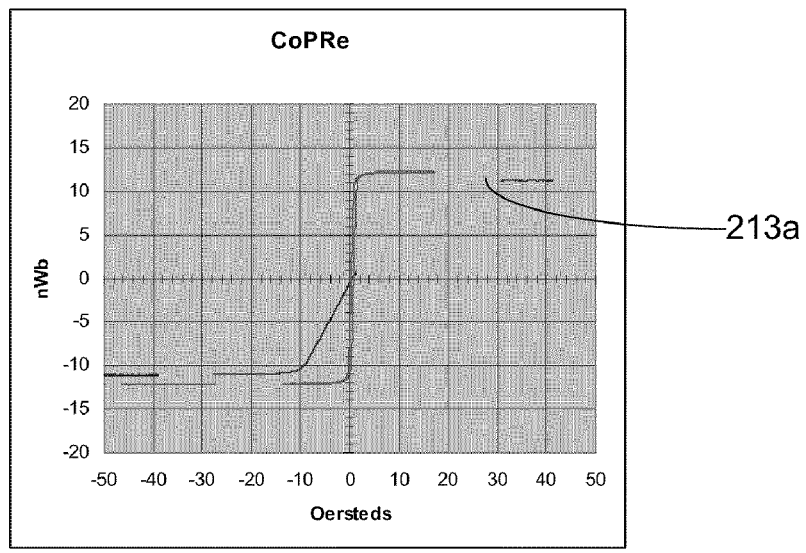
Figure 2C:
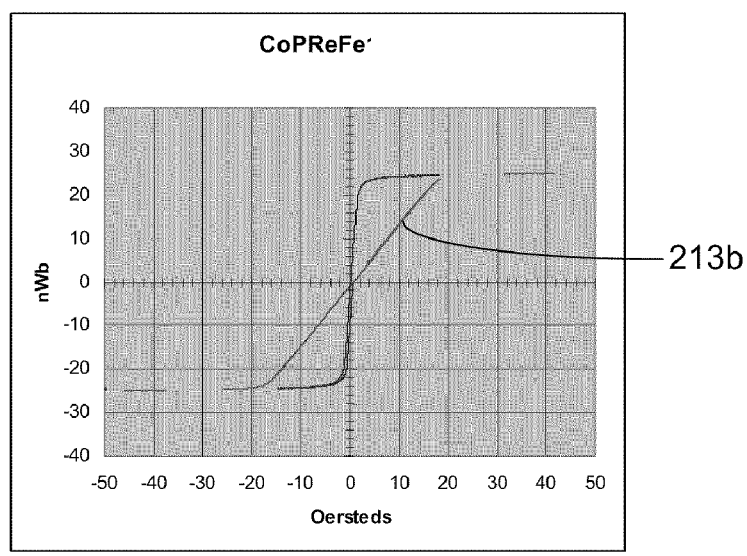

The magnetic material 102, as a ferromagnetic material, can retain a memory of an applied field once the field is removed, which is called hysteresis. The coercivity is the intensity of the applied magnetic field required to reduce the magnetization of that material back to zero after the magnetization has been driven to saturation. For inductors, a small coercivity is desirable to minimize losses, but is typically difficult to achieve. FIGS. 2b-2c show the magnetic hysteresis loops of the magnetic material 102, wherein the magnetic material 102 comprises compositions of CoPRe in FIG. 2a and CoPReFe in FIG. 2b.

As can be seen, the hard axis (which is the axis that would be used for inductors) 213a of FIG. 2b, and the hard axis 213b of FIG. 2c for the CoPRe and CoPReFe compositions respectively is linear and has a minimal coercivity. The coercivity of for these magnetic material 102 compositions is about 0.1~0.3 Oersteds, thereby minimizing magnetic hysteretic losses. In addition, the magnetic material 102 has the capability of withstanding high temperatures, which makes it suitable for use in CMOS processing. For example, CoP films (for example, $Co_{75.8}P_{24.2}$), may comprise a coercivity above about 1.4 Oe at room temperature and above about 13 Oe after annealing at about 300 degrees Celsius.

By adding rhenium (for example, by forming a magnetic material 102 comprising the compositions $Co_{78.9}P_{19.9}Re_{1.0}$ or $Co_{79.2}P_{19.4}Re_{1.4}$) the coercivity is reduced and the magnetic material 102 can withstand high temperatures, such as annealing temperatures, of up to about 330° C. while maintaining coercivities below about 0.3 Oersteds. In another embodiment, the magnetic material 102 of the present invention may comprise a coercivity of below about 1 Oersted, depending upon the particular application. Thus, the magnetic material 102 of the present invention is suitable for use in CMOS processing, such as in conjunction with the use of polyimides as a dielectric material, for example.

Additionally, the iron concentration of the magnetic material 102 can be optimized to increase the magnetic flux saturation up to about 2.0 Tesla in some cases, which is useful for high electric current applications, such as voltage converters. The addition of iron in the magnetic material 102 is a further benefit for increasing the resistivity as well, of the magnetic material 102. In one embodiment, the rhenium concentrations may comprise about 0.1 to about 5.0 atomic percent of the magnetic material 102. In one embodiment, the coercivity of the magnetic material 102 may be optimized by maintaining a phosphorus percentage above about 14 percent. In another embodiment, the atomic percentage of phosphorus may comprise about 8 to about 25 percent and the atomic percentage of rhenium may comprise about 0.1 to about 5 percent. The particular concentrations of the rhenium, cobalt, phosphorus and iron may be varied and optimized depending upon the particular application.

Figure 2D:
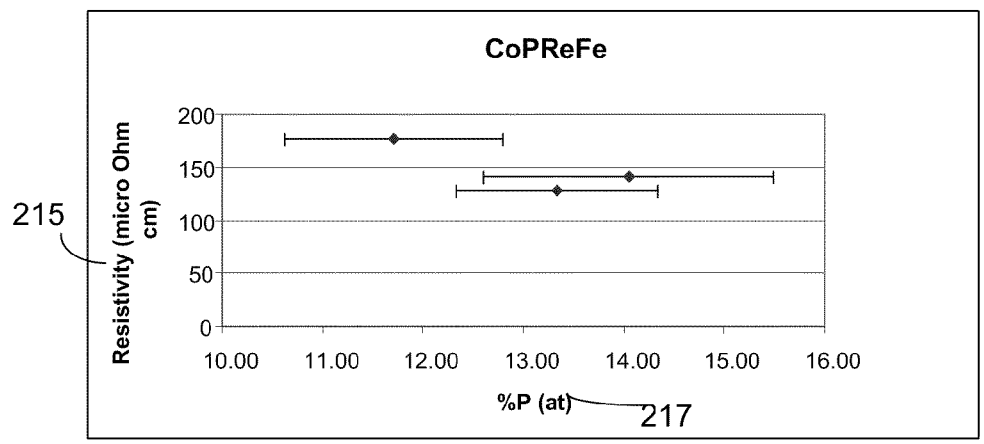

In another embodiment, the phosphorus concentration within the magnetic material 102 may be optimized in order to achieve a desired resistivity of the magnetic material 102, which will minimize eddy current dampening at higher frequencies. FIG. 2d depicts a graph of the resistivity 215 of the magnetic material 102 comprising CoPReFe versus the phosphorus atomic percentage 217. FIG. 2d shows that the resistivity is about 150 $\mu\Omega$-cm for phosphorus percentages between about 10 to about 16 atomic percent, (which may be optimized depending upon the composition), which is about 10 times higher than NiFe permalloy (typically 15-20 mOhm-cm) for example, so that the eddy-current losses may be minimized as compared with the permalloy. In one embodiment, the resistivity of the magnetic material comprises above about 150 micro-ohm centimeters when the phosphorus percentage is above about 14 percent.

Figure 2E:
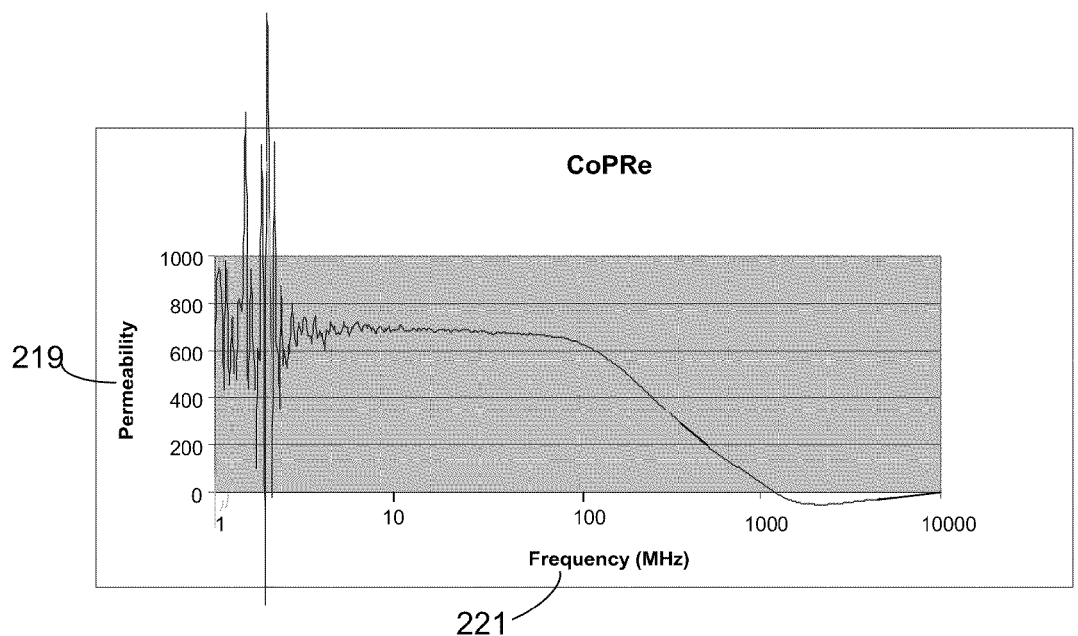

The magnetostriction coefficient for the magnetic material 102 may comprise about $0.5~1.5\times10^{-6}$, significantly lower than pure cobalt at $1.0\times10^{-5}$. FIG. 2e shows the permeability 219 versus the frequency 221 of electroplated CoPRe magnetic material 102 comprising about 2 microns in thickness. In some embodiments, the permeability of the magnetic material 102 may comprise about 700 at frequencies of up to 150 MHz. In one embodiment, a resistivity of the magnetic material 102 may comprise between about 100 micro ohm-centimeters to about 200 micro-ohm centimeters, and a permeability of the magnetic material 102 may comprise about 600 to about 800 from about 0 to about 150 MHz.

Referring back to FIG. 1e, at least one conductive structure 112 may be formed on a thin dielectric layer 114 disposed between the magnetic material 102 and the substrate 100. In one embodiment, the at least one conductive structure 104 may comprise a copper interconnect structure, such as a copper winding structure for example, that may be used as inductor windings, in some cases, and may comprise a thickness 116 of about 1 to about 10 microns. The particular thickness 116 of the at least one conductive structure 112 will vary according to the particular application.

Figure 1F:
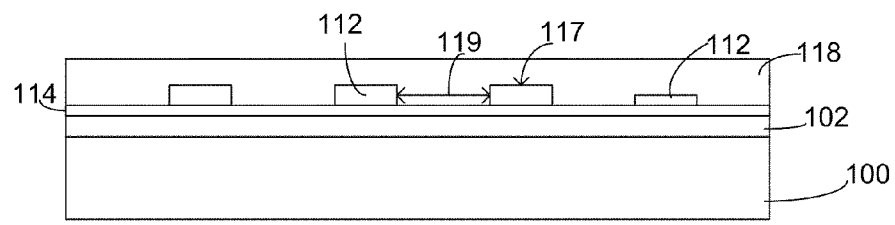
Figure 1G:
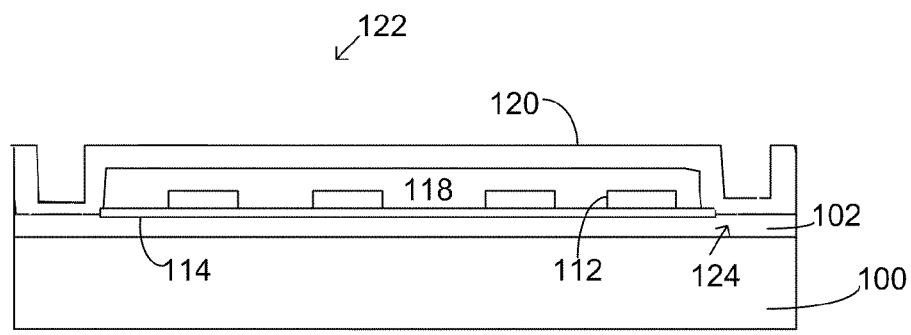

In some embodiments, a dielectric layer 118 such as polyimide layer 118 may be formed on and around the at least one conductive structure 112 (FIG. 1f). In one embodiment, the dielectric layer 118 may be formed on a top surface 117 and in the spaces 119 between the individual conductive structures 112.

In one embodiment, a second layer of magnetic material 120 (which may comprise similar materials to the first layer of magnetic material 102) may be formed on the at least one conductive structure 112 (FIG. 1g) to form an inductive structure 122. The inductive structure 122 may comprise various inductor and transformer structures/devices, for example, and may be used in microelectronic circuits such as on-chip and/or on package voltage converters, RF high-frequency circuits, radar and EMI noise reduction circuits. In one embodiment, the inductive structure 122 may comprise a portion of a package substrate that may comprise submicron CMOS devices, and may comprise high-frequency amorphous magnetic materials and multilevel metallization.

In some devices, to obtain a maximum theoretical increase in inductive magnetic flux, the two layers of magnetic material 102, 120 need to make contact so that the magnetic flux loss is minimized to zero. At high operating frequencies, the apparent inductance of prior art devices may gradually decrease with frequency because there may be losses from eddy currents that flow in the magnetic material. Thus, carefully designed magnetic vias serve to maximize the inductance of such high frequency inductive structures, such as the inductive structure 122.

Without a good magnetic connection, the magnetic flux may escape, resulting in significant loss in inductance for the device. The magnetic connection may comprise a magnetic via 124, which comprises the region wherein the first layer of magnetic material 102 and the second magnetic layer 120 make contact with each other to complete the circuit for the magnetic flux.

In another embodiment, the magnetic material 102 may comprise a portion of other inductor structures (not shown) that are known in the art. The magnetic material 102, 120 described herein is not limited for use in the inductor structure 122, but may find application in any type of inductor/transformer/microelectronic structure as in known in the art. In addition, the magnetic material 102, 120 may be used in microelectronic circuits such as on-chip and/or on package voltage converters, RF high-frequency circuits, radar and EMI noise reduction circuits. In one embodiment, the magnetic material 102, 120 may comprise a portion of a package substrate that may comprise submicron CMOS devices, and may comprise high-frequency amorphous magnetic materials and multilevel metallization.

Figure 3:
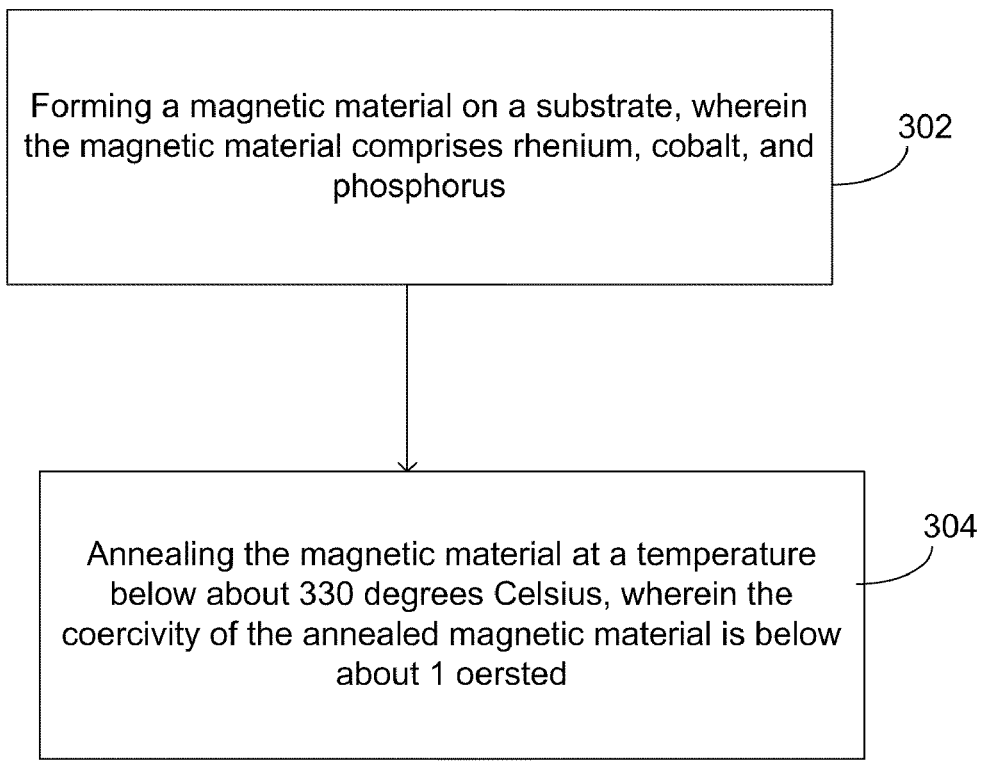
FIG. 3 represents a flow chart according to embodiments of the present invention.

In another embodiment shown in FIG. 3, a magnetic material may be formed on a substrate, wherein the magnetic material comprises rhenium, cobalt, and phosphorus at step 302. At step 304, the magnetic material may be annealed at a temperature below about 330 degrees Celsius, wherein the coercivity of the annealed magnetic material is below about 1 Oersted. In another embodiment, the annealed magnetic material may comprise a coercivity below about 0.3 Oersted. In another embodiment, the annealed and un-annealed magnetic material may comprise substantially the same percentage of rhenium, cobalt and phosphorus. In another embodiment, the annealed and un-annealed magnetic material may additionally comprise a portion of iron, according to the particular application. In another embodiment, the magnetic material may additionally comprise iron.

Benefits of the present invention include the enabling of high-frequency inductors and transformers with magnetic films that are capable of operating at frequencies above about 30 MHz. Secondly, the use of two layers of magnetic material leads to a significant increase in inductance, so that magnetic vias are needed. Third, it is difficult to deposit thicker films (5~10 microns) using conventional sputter techniques, so the electroplating methods described herein are advantageous for the formation of thicker films. Fourth, the resistivity of the new alloys presented herein are substantially higher (~150 $\mu\Omega$-cm) than that of other materials such as NiFe (~16 $\mu\Omega$-cm) and CoZrTa, which will result in less eddy current dampening at high frequencies. Fifth, the new alloys of CoPRe, CoPReFe can sustain their excellent magnetic properties up to temperatures of about 330 degrees Celsius.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as microelectronic structures, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A structure comprising:
   a magnetic material comprising rhenium, phosphorus and cobalt on a substrate, wherein the atomic percentage of phosphorus comprises about 8 to about 25 percent and the atomic percentage of rhenium comprises about 0.1 to about 5 percent, and wherein the magnetic material comprises a coercivity below about 1 Oersted; and
   wherein the magnetic material comprises a portion of an inductor structure.

2. The structure of claim 1 wherein the magnetic material comprises a series of alternating nanolayers of a high phosphorus percentage nanolayer and a low phosphorus percentage nanolayer.

3. The structure of claim 2 wherein the high phosphorus percentage nanolayer comprises a thickness of below about 5 nm and the low percentage phosphorous nanolayer comprises a thickness of about 40 nm or less.

4. The structure of claim 1 wherein the magnetic material comprises a thickness of about 0.5 microns to about 30 microns.

5. The structure of claim 1 wherein the magnetic material comprises iron, and wherein a magnetic flux saturation of the magnetic material comprises about below about 2.0 Tesla.

6. The structure of claim 1 wherein a wherein a resistivity of the magnetic material comprises between about 100 micro ohm-centimeters to about 200 micro-ohm centimeters, and wherein a permeability of the magnetic material comprises about 600 to about 800 from about 0 to about 150 MHz.

7. The structure of claim 1 wherein the structure comprises a portion of package structure comprising a multilevel metallization CMOS structure.

8. The structure of claim 1 wherein the inductor structure comprises a portion of at least one of an on-chip and an on-package voltage converter, an RF high-frequency circuit, an EMI noise reduction circuit and radar circuitry.

* * * * *